(12) United States Patent
Muehe

(10) Patent No.: US 11,965,267 B2
(45) Date of Patent: Apr. 23, 2024

(54) METHOD FOR PULLING A CYLINDRICAL CRYSTAL FROM A MELT

(71) Applicant: PVA TePla AG, Wettenberg (DE)

(72) Inventor: Andreas Muehe, Wetzlar (DE)

(73) Assignee: PVA TePla AG, Wettenberg (DE)

( * ) Notice: Subject to any disclaimer, the term of this patent is extended or adjusted under 35 U.S.C. 154(b) by 49 days.

(21) Appl. No.: 17/310,315

(22) PCT Filed: Jan. 24, 2020

(86) PCT No.: PCT/DE2020/200007
§ 371 (c)(1),
(2) Date: Jul. 27, 2021

(87) PCT Pub. No.: WO2020/156621
PCT Pub. Date: Aug. 6, 2020

(65) Prior Publication Data
US 2022/0098755 A1  Mar. 31, 2022

(30) Foreign Application Priority Data
Jan. 28, 2019  (DE) .................... 10 2019 101 991.5

(51) Int. Cl.
*C30B 15/14* (2006.01)
*C30B 15/20* (2006.01)
*C30B 15/30* (2006.01)
*C30B 29/06* (2006.01)

(52) U.S. Cl.
CPC ............ *C30B 15/203* (2013.01); *C30B 15/14* (2013.01); *C30B 15/30* (2013.01); *C30B 29/06* (2013.01)

(58) Field of Classification Search
CPC ........ C30B 15/14; C30B 15/203; C30B 15/30; C30B 29/06
See application file for complete search history.

(56) References Cited

U.S. PATENT DOCUMENTS

| 6,458,203 B1 | 10/2002 | Hanamoto et al. |
| 9,340,897 B2 | 5/2016 | Schroeck |
| 2002/0152950 A1* | 10/2002 | Aufreiter ............... C30B 15/22 117/14 |
| 2011/0126757 A1 | 6/2011 | Schroeck et al. |

(Continued)

FOREIGN PATENT DOCUMENTS

| DE | 10 2013 210 687 A1 | 12/2014 |
| EP | 2 659 031 B1 | 11/2013 |

(Continued)

OTHER PUBLICATIONS

European Patent Office, English computer translation KR 10-2015-0089718 (Year: 2022).*

(Continued)

*Primary Examiner* — Matthew J Song
(74) *Attorney, Agent, or Firm* — Reising Ethington P.C.

(57) ABSTRACT

A method for pulling a cylindrical crystal from a melt by a crystal pulling unit includes measuring an actual value of a diameter of the crystal at a surface of the melt, comparing the actual value with a setpoint value for the diameter of the crystal, and setting a height of the annular gap as a function of a deviation between the actual value and the setpoint value using a first controller which has a first readjustment time.

6 Claims, 4 Drawing Sheets

(56) References Cited

U.S. PATENT DOCUMENTS

2013/0263773 A1   10/2013  Takanashi et al.
2014/0360425 A1*  12/2014  Schroeck ................ C30B 29/06
                                                           117/15

FOREIGN PATENT DOCUMENTS

| | | | |
|---|---|---|---|
| JP | 2000313691 A | | 11/2000 |
| JP | 2005015313 A | | 1/2005 |
| JP | 2006203111 A | | 8/2006 |
| JP | 2014237580 A | | 12/2014 |
| KR | 20150070826 A | * | 6/2015 ............. C30B 15/20 |
| KR | 10-2015-0089718 A | | 8/2015 |
| KR | 20150089718 A | * | 8/2015 ............. C30B 15/14 |
| WO | WO 01/57294 A1 | | 8/2001 |

OTHER PUBLICATIONS

European Patent Office, English computer translation KR 10-2015-0070826 (Year: 2022).*

English-language German Search Report issued in German application No. 10 2019 101 991.5 dated Sep. 5, 2019 (Eight (8) pages).

PCT/DE2020/200007, International Search Report dated Apr. 29, 2020 (Two (2) pages).

Japanese Office Action with English summary corresponding application 2021-543428, dated Dec. 5, 2023, 7 pages.

* cited by examiner

METHOD FOR PULLING A CYLINDRICAL CRYSTAL FROM A MELT

BACKGROUND AND SUMMARY OF THE INVENTION

The invention pertains to a method for pulling a cylindrical crystal from a melt by means of a crystal pulling unit which comprises: a crucible, in which the melt is located, a crucible heater, which surrounds the crucible annularly, a crucible lifting device for lifting the crucible, a crystal lifting device for pulling the crystal from the melt, and a heat shield surrounding the crystal annularly and having a lower edge which ends above the melt, forming an annular gap.

In the growing of crystals by the Czochralski process, a crystal is pulled from a hot melt, with the atoms of the melt taking their place at the lower end face of the crystal in a lattice structure typical of the material of the melt, so that, in the course of slow pulling of the crystal out of the melt, in the course of which the crystal cools, a rigid crystal lattice is produced. The layer of the crystal that is close to the melt initially still contains intrinsic point defects, namely vacancies, meaning unoccupied lattice sites, and interstitial atoms, being atoms between the lattice sites; however, if the pulling procedure is carried out with suitable parameters, pairs of these defects undergo mutual annihilation, and so a homogeneous and largely defect-free crystal lattice is formed. This mode of crystal growing is used, for example, to produce silicon crystals which are needed for the semiconductor industry. For that purpose, thin slices, known as wafers, are cut from the crystal, and integrated circuits are produced from them.

The intention generally is to design a pulling procedure in such a way that the pulled crystal has an as far as possible constant diameter and, as a result of as far as possible complete annihilation of the intrinsic point defects, has a high homogeneity.

DE 10 2013 210 687 A1 describes a method for regulating the diameter of a crystal, by directly or indirectly determining the diameter of the crystal at the melt surface and comparing it with a desired setpoint diameter. From this a suitable crystal pulling rate is derived as a control variable for the crystal lifting device, so that the desired crystal diameter is established. Other examples of conventional diameter regulation are found in WO 01/57294 A1 and US 2011/0126757 A1.

This crystal pulling rate is the relative rate of the crystal with which it moves relative to the melt surface. Since this rate is typically set at an absolute melt surface level of constant height in relation to the crystal pulling unit, the crystal pulling rate corresponds to the absolute crystal lifting rate—that is, to the rate of the crystal relative to the stationary parts of the crystal pulling unit.

The crystal pulling rate also, however, affects the homogeneity of the crystal. The aforementioned healing of the intrinsic point defects is brought about by mutual compensation of those intrinsic point defects still present at the end face of the crystal, in the lower layers of the crystal, the layers close to the melt; this compensation takes place through migration of the interstitial atoms into the vacancies. Because the diffusion rates of the interstitial atoms and of the vacancies are different, virtually complete compensation can only be achieved when there is a defined ratio between the crystal pulling rate and the vertical temperature gradient in the crystal. Because the temperature gradient is specific to material and to unit, the ratio of crystal pulling rate to vertical temperature gradient, in the case of diameter regulation utilizing the crystal pulling rate as a control variable, changes in the same measure as the crystal pulling rate, and so the ratio does not always have a value which is necessary in order to maximize crystal homogeneity. It is this kind of homogeneity, however, which is demanded by producers of integrated circuits in order to minimize their production rejects.

In the control of the silicon Czochralski process there are two characteristic timescales:

(A) The timescale from minutes to tens of minutes, being the timescale for fluctuations in the melting convection. Because of the thermally unstable laying of the melt in the Czochralski arrangement, there is a typical melting convection, which is unsteady and in fact often turbulent, and which critically influences heat transport and mass transport through the melt. As a consequence there is a fluctuation in the temperature at the growth front of the crystal, leading in practice to arbitrary fluctuations in diameter on the millimeter length scale.

(B) The timescale from hours to tens of hours, being the timescale of a change in melt level resulting from the continuous withdrawal of silicon by the growing crystal, starting from an almost full crucible at the start of operation to an almost empty crucible at the end of operation. Because of this continuous change in the melt level, there is a change in the macroscopic geometry of the crystal-growing setup, particularly in the crucible position relative to the main heater and bottom heater, but also in the ratio between free melt surface and wetted crucible wall area.

In order to be able to carry out controlled setting firstly of the crystal diameter and secondly of the crystal quality—here, in particular, the oxygen concentration and the concentration of point defects—there are always at least 2 closed-loop control circuits used in the state of the art, with one control circuit operating with a first controller on the timescale (A) and therefore compensating predominantly influences of the melting convection, while a second control circuit operates with a second controller on the timescale (B) and therefore compensates predominantly influences of the change in the melt level in the crucible.

The first controller adapts the crystal pulling rate, while the second controller sets the power of the crucible heater.

Because the regulation of the crystal diameter according to the state of the art is accomplished via adaptation of the crystal pulling rate, which is consequently subject to continual change, the homogeneity of the pulled crystal may not be optimum.

The invention is therefore based on the object of setting out a control algorithm for a crystal pulling procedure that provides a homogeneous and very largely defect-free crystal having a very largely consistent diameter.

For achieving the object, the invention provides that the actual value of the crystal diameter is measured at the melt surface and compared with a setpoint value for the crystal diameter, and that the height of the annular gap is set as a function of the deviation between the actual value and the setpoint value, using a first controller, which has a first readjustment time, and that the crystal pulling rate is kept constant.

In the state of the art (EP 2 659 031 B1 or U.S. Pat. No. 6,458,203 B1) there is indeed a general reference to the significance of the annular gap, but without explicit statement that its height should be influenced, while retaining the crystal pulling rate, such that the crystal diameter is regulated to a constant value.

The temperature of the crystal at its lateral surface immediately above the melt surface has a substantial influence both on crystal homogeneity and on the developing diameter. If, therefore, it is possible through suitable measures to rule out any irradiation of heat in this lower region of the lateral surface, the vertical temperature gradient over the diameter of the crystal is uniform, and so, with a suitable crystal pulling rate over the whole diameter of the crystal, an optimal value is present for the ratio of crystal pulling rate to temperature gradient, this value enabling virtually complete recombination of lattice vacancies and interstitial atoms.

It has emerged, furthermore, that in the event of increased lateral irradiation of heat, the marginal region of the crystal undergoes cooling and therefore widens, or, in the event of inward radiation of heat into the crystal, it contracts. Because an increase in the annular gap is accompanied by an increase in the thermal output impinging, through radiation, on the lower lateral crystal surface, the surface temperature of the lateral crystal surface is increased, and hence the heat flow/vertical temperature gradient leading away from the phase boundary in the crystal is reduced. Consequently less latent heat is able to flow off from the phase boundary, and this, for an even pulling rate, leads to a decreasing crystal diameter.

This influence of the inward or outward radiation of heat on the homogeneity of the crystal is also addressed in DE 10 2013 210 687 A1 itself. In order to be able to influence this, the crucible heater is supplemented by an annular heater directly against the crystal. This heater may likewise be used to regulate the diameter of the crystal, with the control variable of the regulation being directed at influencing the electrical power of this annular heater. A disadvantage of this approach, however, is that an additional annular heater is required, which, furthermore, is located at a heat-exposed site and is therefore at particular risk of failure.

The invention therefore provides not for the utilization of an additional annular heater, but instead for the utilization of the irradiation of heat by the existing crucible heater, which serves to heat the melt at a defined temperature. The irradiation of heat by the crucible heater, indeed, impinges through the annular gap on the lower lateral surface of the crystal, and so the inward radiation of heat onto the crystal and the irradiation of heat by the crystal can be regulated by changing the annular gap height. There is therefore no need for dedicated annular heating.

Preferably the first readjustment time is selected so as to compensate influences of the melting convection at the melt-contacting end face of the crystal and of the melt. There is therefore an adaptation of the annular gap height in the timescale (A).

The regulation provides that for an actual diameter value which is smaller than the setpoint value, the annular gap height is reduced, and for an actual value which is larger than the setpoint value, the annular gap height is increased.

The further advantage of this regulation is that the crystal pulling rate, being the rate at which the crystal is moved relative to the melt surface, is kept constant. For this purpose, the lifting rate of the crucible, which takes account of the loss of volume of the melt, and the lifting rate of the crystal are each altered in the same measure in relation to the unit; as a result of this, indeed, there is no change in the crystal pulling rate, but there is a change in the distance of the melt surface from the lower edge of the heat shield and hence in the height of the annular gap.

For this purpose the regulation generates a control value for the annular gap height. An offset rate is determined for this purpose. This rate is added not only to a base value for the lifting rate of the crucible that is required in order to compensate the volume consumption of the melt, but also to a base value for the rate of the crystal lifting which corresponds to the desired crystal pulling rate for a constant level of the melt surface. The offset value is positive or negative depending on whether the annular gap height is to be increased or reduced.

Because the two rates are changed m equal measure, the crystal pulling rate remains unaffected. There is, however, a change in the annular gap height, and so the melt surface moves closer to or further from the lower margin of the heat shield, as a result of the change in crucible lifting rate.

This internal regulation is also overlaid by an external regulation, which is aimed at the heating power of the crucible heater. The invention therefore provides that the control value for the annular gap height is supplied as actual value, for regulation of the heating power of the crucible heater, by means of a second controller, which has a second readjustment time, with a medial annular gap height being specified as setpoint value.

In this case the second readjustment time is selected so as to compensate influences of the changes in the position of the melt surface in the crucible that come about during the pulling procedure. The regulation therefore takes place on the timescale (B).

This means that the first readjustment time is smaller than the second readjustment time.

In the external regulation, the time-averaged control value for the annular gap height is supplied as actual value to the heating power regulator. This is preferably accomplished by supplying the control value via a PT1 filter to the heating power regulator, as a modified control value.

The invention is elucidated in more detail below with a working example.

DETAILED DESCRIPTION OF THE DRAWINGS

Figure 1:
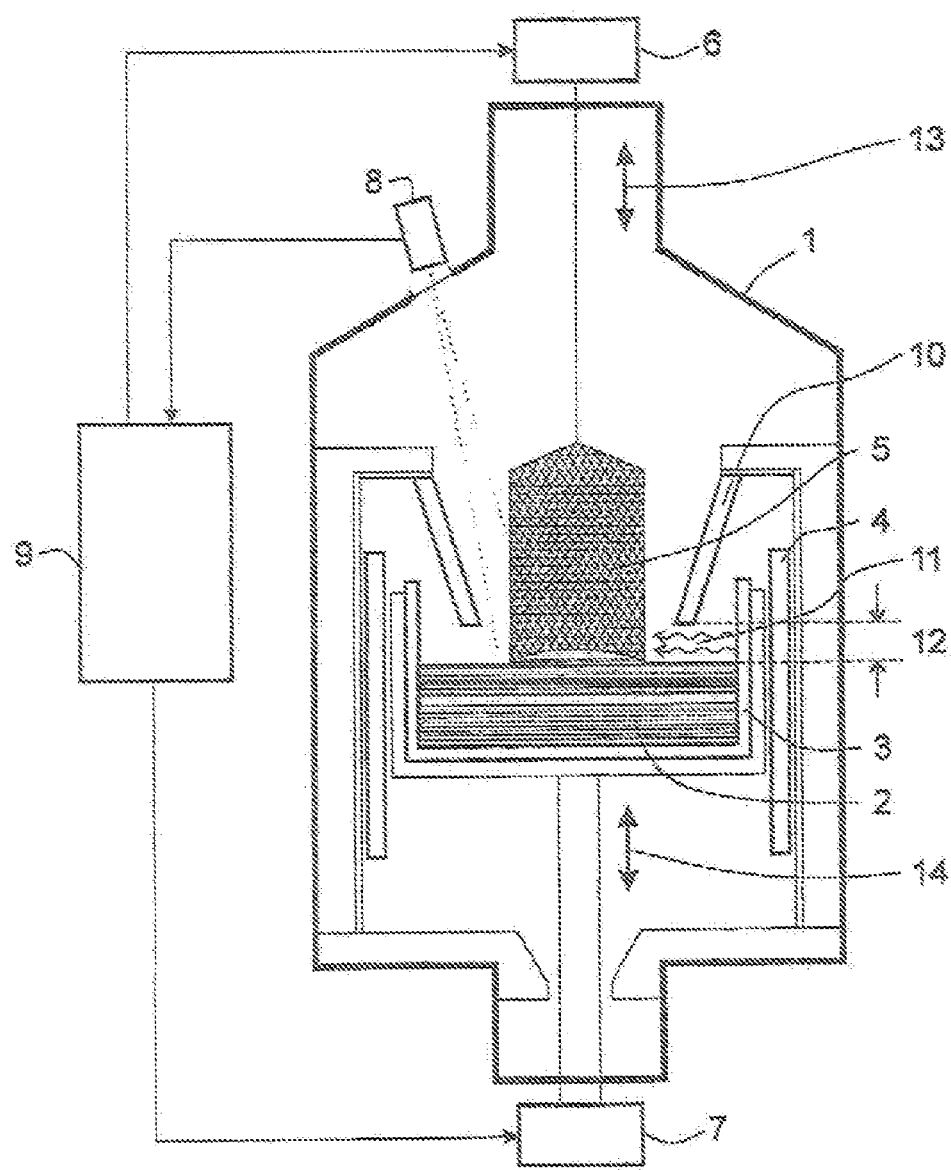
FIG. 1 shows a schematic representation of a Czochralski-process crystal pulling unit.

Reference is made first to FIG. 1. According to FIG. 1, the crystal pulling unit consists of a unit housing 1, in which a crucible 3 filled with a melt 2 is located. Located around the crucible is a crucible heater 4, which is used to melt the material in the crucible 3 and then maintain it at temperature.

A cylindrical crystal 5 is pulled slowly from the melt 2 by means of a crystal lifting device 6, with the atoms of the melt 2 taking their place at the lower end face of the crystal 5 and forming a crystal lattice as the crystal is pulled out of the melt 2. In the course of this process, material in the crucible 3 is consumed, and so crystal pulling units typically provide a crucible lifting device 7, with which the crucible 3 is repositioned, so that the melt surface is always located at a constant level in relation to the unit housing 1.

The crystal diameter is captured by means of a camera 8, which is directed at the margin of the crystal at the transition to the melt. The crystal diameter can be derived from the images obtained by the camera 8. The image analysis processes employed for this purpose are known to the skilled person and need not, therefore, be elucidated in more detail here.

The crystal pulling procedure is regulated by means of a control device 9. This device contains information from the camera 8 and transmits control variables to the crystal lifting device 6 and to the crucible lifting device 7.

So that the crystal pulled from the melt can gradually cool, a heat shield 10 surrounding the crystal is necessary, which keeps the radiation from the crucible heater 4 and from the hotmelt away from the upper region of the lateral surface of the crystal 5.

The lower edge of the heat shield 10 ends above the surface of the melt 2, and so there is an annular gap 12 between the edge of the heat shield 10 and the melt. By virtue of this annular gap 12, heat is irradiated into the lower region of the lateral surface of the crystal 5.

The parameters relevant to the control of the pulling procedure are as follows: the decisive parameter ultimately is the crystal pulling rate, being the rate of the crystal relative to the melt surface. It is determined by the absolute lifting rate 13 of the crystal, which is the rate at which the crystal is moved relative to the unit, and by the rate of the melt surface relative to the unit. If this is set at zero, and the melt surface is therefore held at a constant level in relation to the unit, the crystal pulling rate corresponds to the absolute lifting rate 13 of the crystal.

The rate of the melt surface in relation to the unit is determined by the absolute lifting rate 14 of the crucible, taking account of the lowering of the melt surface within the crucible caused by the consumption of material. The lifting rate of the crucible may be determined, for example, by ascertaining the increase in material of the crystal 5 using the crystal pulling rate, and so the lowering of the melt surface in relation to the crucible 3 is compensated by a corresponding lifting of the crucible 3, so that the melt surface remains at a constant level in relation to the unit.

Figure 2:
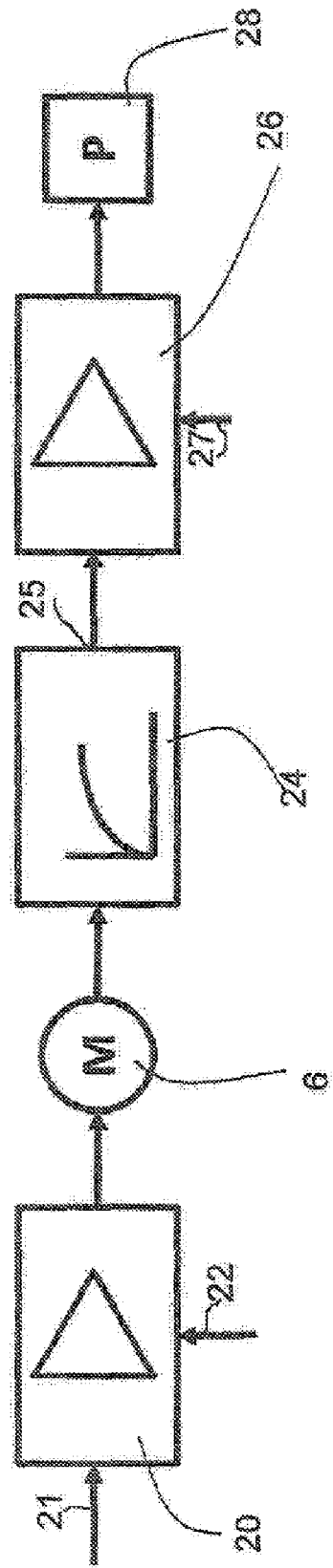
FIG. 2 shows a closed-loop control scheme according to the state of the art.

FIG. 2 depicts a closed-loop control scheme which is used to regulate a crystal pulling procedure, according to the state of the art, in order to achieve a very largely constant diameter of the crystal. This scheme consists of a diameter controller 20, which receives an actual diameter value at a first input 21 and a setpoint diameter value at a second input 22. A control value for the crystal lifting device 6 is output at the output 23 of the diameter controller 20.

In order to prevent excessive drift of the crystal pulling rate, the control value is also supplied to a PT1 filter 24, whose output 25 is supplied as actual value to a controller 26 for a medial crystal pulling rate. For this purpose there is a setpoint value for the medial crystal pulling rate at an input 27. Through a comparison of actual value and setpoint value, a control value for the heating power of the crucible heater 4 is generated, and is supplied to a heating power regulator 28.

Figure 3:
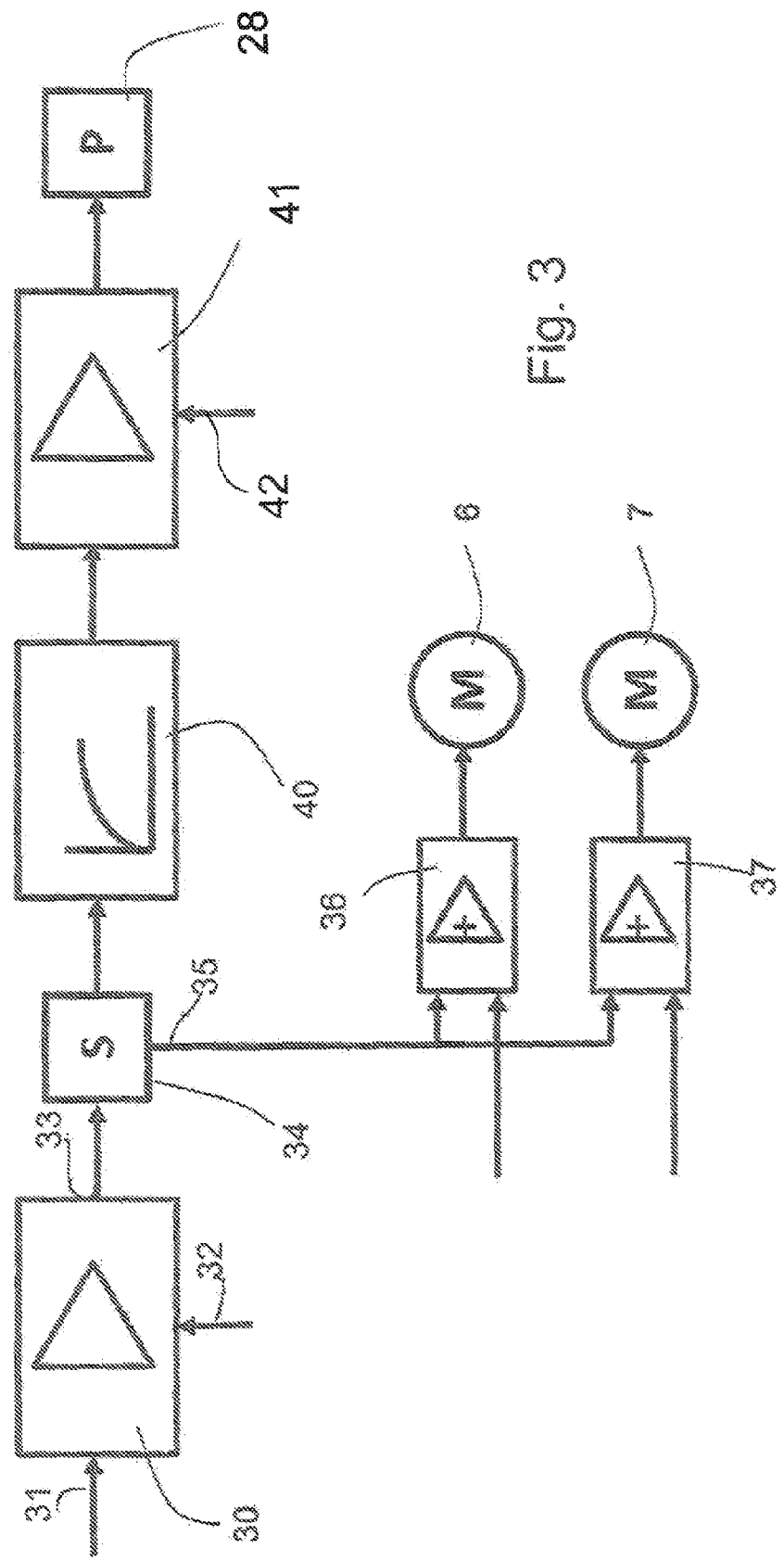
FIG. 3 shows a closed-loop control scheme in accordance with the invention.

In contrast to this, according to FIG. 3, the closed-loop control scheme of the invention consists of a diameter controller 30, which is supplied at a first input 31 with an actual value for the crystal diameter and at a second input 32 with a setpoint value for the crystal diameter. At the output 33, the diameter controller 30 generates a control value for the annular gap height, which is made available to an annular gap height regulator 34.

This regulator generates an offset value at its output 35, the value being supplied both to a crystal lifting regulator 36 and to a crucible lifting regulator 37. In the regulators 36 and 37, the offset value is added to a base value for the crucible lifting rate 14 and to a base value for crystal lifting rate 13, respectively, and so the crystal lifting rate 13 and the crucible lifting rate 14 change in equal measure, without any change in the crystal pulling rate. The crucible lifting base value is the value with which the melt surface, taking account of the consumption, is maintained at a constant level. The crystal lifting base value is the value of the desired crystal pulling rate.

Critical to the invention, therefore, is that while there is a change in the crystal lifting rate 13, there is no change in the crystal pulling rate at which the crystal 5 lifts from the melt 2. The crucible 3 changes its position here in such a way that the melt surface is displaced in relation to the bottom edge of the heat shield 10, causing a change in the height of the annular gap 12. The inward radiation of heat from the crucible heater 4 into the lower lateral surface of the crystal can therefore be kept at a value at which, at least in the lower region of the crystal, there is no irradiation of heat, and so, for a constant crystal pulling rate, the diameter of the crystal 5 is constant and the ratio of temperature gradient to crystal pulling rate is optimal.

Here as well, a slow external closed-loop control circuit is overlaid on the inner closed-loop control circuit. The control value for the gap height regulator is supplied via a PT1 filter 40 to a controller 41 for the medial annular gap height. This value is compared with a setpoint value at the input 42 for the medial annular gap height, and, as a result, a corresponding control value is made available for the heating power regulator 28. Because the PT1 filter 40 changes the actual value, relevant for the heating power regulator 28, in proportion to the temporal change in the control value for the annular gap height regulator 34, the control procedure for the external closed-loop control circuit is slowed.

Figure 4:
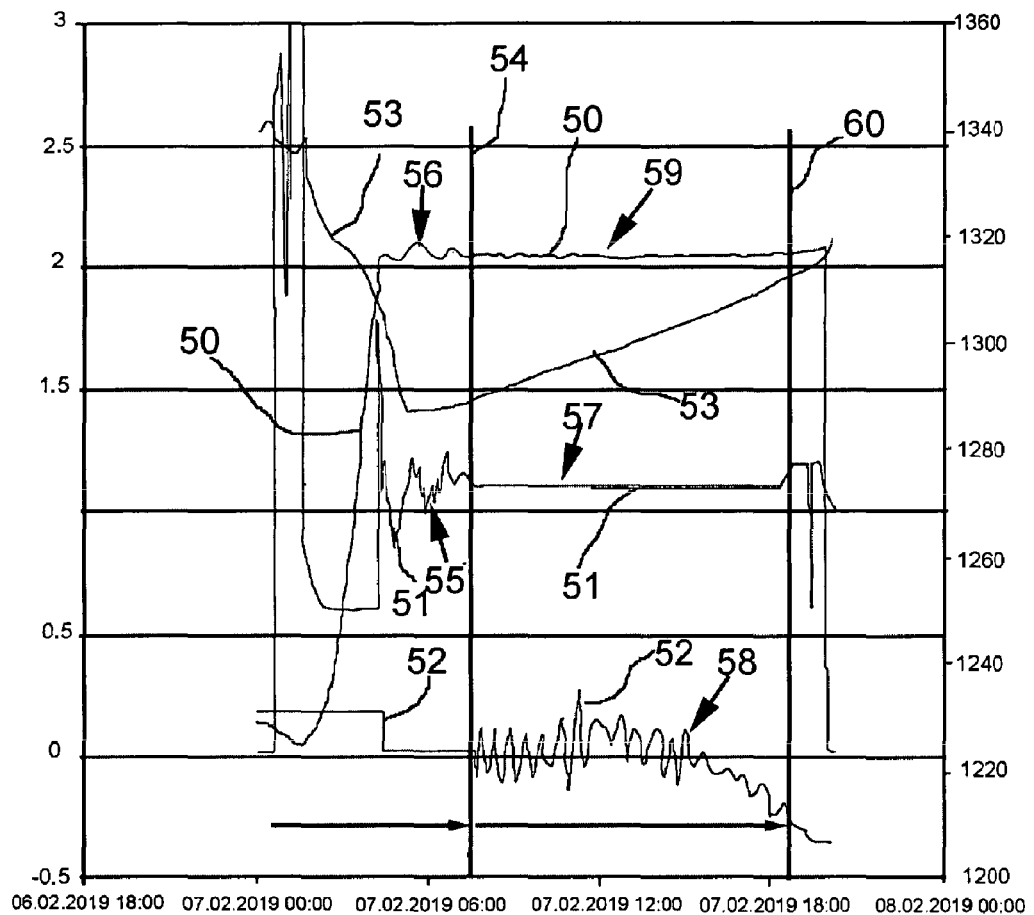
FIG. 4 shows a record of a crystal pulling procedure in diagram form.

FIG. 4 shows the temporal profile, over several hours, of the actual crystal diameter value (curve 50), measured with a camera, the crystal pulling rate (curve 51), the height of the annular gap (curve 52) and the temperature of the crucible heater (curve 53).

In the first phase of the growing experiment—shown up to the first timeline 54—the crystal diameter is regulated with a conventional controller cascade by way of the pulling rate in the internal closed-loop control circuit, and via the temperature of the main heater in the external closed-loop control circuit. Clearly apparent are the fluctuations in the pulling rate (indicator arrow 55) on the timescale (A), which accompany a significant change in the crystal diameter (indicator arrow 56).

Subsequently (from the first timeline 54 on), the control of the crystal pulling unit was switched over to regulation in accordance with the invention, using the annular gap height as control variable in the internal closed-loop control circuit, and using, still, the temperature of the main heater as control variable in the external closed-loop control circuit. It is apparent that after the switch, the pulling rate was kept entirely constant (indicator arrow 57), whereas now there is fluctuation of the annular gap height on the timescale (A) (indicator arrow 58). With this regulation, a substantially consistent crystal diameter is achieved (indicator arrow 59). The experiment was discontinued at a second timeline 60.

LIST OF REFERENCE CHARACTERS

| | |
|---|---|
| 1 | Unit housing |
| 2 | Melt |

| | |
|---|---|
| 3 | Crucible |
| 4 | Crucible heater |
| 5 | Crystal |
| 6 | Crystal lifting device |
| 7 | Crucible lifting device |
| 8 | Camera |
| 9 | Control Device |
| 10 | Heat shield |
| 12 | Annular gap |
| 13 | Crystal lifting rate |
| 14 | Crucible lifting rate |
| 20 | Diameter controller |
| 21 | Input |
| 22 | Input |
| 23 | Output |
| 24 | PT1 filter |
| 25 | Output |
| 26 | Controller |
| 27 | Input |
| 28 | Heating power regulator |
| 30 | Diameter controller |
| 31 | Input |
| 32 | Input |
| 33 | Output |
| 34 | Annular gap height regulator |
| 35 | Output |
| 36 | Crystal lift regulator |
| 37 | Crucible lift regulator |
| 40 | PT1 filter |
| 41 | Controller |
| 42 | Input |
| 50 | Curve |
| 51 | Curve |
| 52 | Curve |
| 53 | Curve |
| 54 | Timeline |
| 55 | Indicator arrow |
| 56 | Indicator arrow |
| 57 | Indicator arrow |
| 58 | Indicator arrow |
| 59 | Indicator arrow |
| 60 | Timeline |

The invention claimed is:

1. A method for pulling a cylindrical crystal (5) from a melt (2) by a crystal pulling unit, the crystal pulling unit comprising:
   a crucible (3) in which the melt (2) is disposed;
   a crucible heater (4) which surrounds the crucible (3) annularly;
   a crucible lifting device (7) for lifting the crucible (3);
   a crystal lifting device (6) for pulling the crystal (5) from the melt (2); and
   a heat shield (10) surrounding the crystal (5) annularly and having a lower edge which ends above the melt (2) and forms an annular gap (12);
   and comprising the steps of:
   measuring an actual value of a diameter of the crystal at a surface of the melt;
   comparing the actual value with a setpoint value for the diameter of the crystal; and
   setting a height of the annular gap (12) as a function of a deviation between the actual value and the setpoint value using a first controller which has a first readjustment time;
   wherein when the actual value is smaller than the setpoint value the height of the annular gap (12) is reduced and wherein when the actual value is larger than the setpoint value the height of the annular gap (12) is increased;
   wherein for changing the height of the annular gap (12), a lifting rate (14) of the crucible (3) and in equal measure a lifting rate (13) of the crystal (5) are varied so that a crystal pulling rate remains constant.

2. The method according to claim 1, wherein for the lifting rate (14) of the crucible (3) a first base value is set which compensates a volume consumption of the melt (2), wherein a second base value is set for the lifting rate (13) of crystal (5), and wherein for regulating the height a same offset value is added to both the first base value and the second base value.

3. The method according to claim 1, wherein a control value for the height is supplied as an actual value for regulating a heating power of the crucible heater (4) by a second controller, which has a second readjustment time, with a medial annular gap height being prespecified as a setpoint value.

4. The method according to claim 3, wherein the second readjustment time is selected so as to compensate influences of changes in a position of the surface of the melt in the crucible that come about during the pulling.

5. The method according to claim 4, wherein the first readjustment time is smaller than the second readjustment time.

6. The method according to claim 4, wherein the control value for the height is supplied via a PT1 filter (40) as an actual value to a heating power regulator (28).

* * * * *